United States Patent [19]

Url

[11] 4,379,345
[45] Apr. 5, 1983

[54] DYNAMIC READ AMPLIFIER FOR METAL-OXIDE-SEMICONDUCTOR MEMORIES

[75] Inventor: Karlheinz Url, Munich, Fed. Rep. of Germany

[73] Assignee: Siemens Aktiengesellschaft, Berlin & Munich, Fed. Rep. of Germany

[21] Appl. No.: 281,424

[22] Filed: Jul. 8, 1981

[30] Foreign Application Priority Data

Jul. 29, 1980 [DE] Fed. Rep. of Germany ....... 3028754

[51] Int. Cl.$^3$ .............................................. G11C 7/06
[52] U.S. Cl. .................................... 365/205; 365/208; 307/530
[58] Field of Search ....................... 365/205, 207, 208; 307/530

[56] References Cited

U.S. PATENT DOCUMENTS

| | | | |
|---|---|---|---|
| 4,060,740 | 11/1977 | Nishimura | 307/530 |
| 4,077,031 | 2/1978 | Kitagawa et al. | 365/205 |
| 4,110,841 | 8/1978 | Schroeder | 365/205 |
| 4,170,741 | 10/1979 | Williams | 365/208 |

Primary Examiner—Stuart N. Hecker
Attorney, Agent, or Firm—Hill, Van Santen, Steadman, Chiara & Simpson

[57] ABSTRACT

A dynamic read amplifier for MOS memories comprises a flip-flop which includes two first switching transistors whose low end can be applied to ground by way of a cut-through transistor in response to a first clock pulse and whose outputs are connected to data lines via cut-off transistors which are controlled by a second clock pulse, whereby the data lines can be charged to the supply voltage by way of a pair of charging transistors in response to a third clock pulse. Given such dynamic read amplifiers for semiconductor memories, the regeneration of a logic "1" level, for example, is possible after an evaluation operation without additional leakage power. Therefore, two additional switching transistors and two further charging transistors are provided, as well as two additional data lines, so that only the respective data line with the logic "1" signal is connected to the supply voltage. By so doing, even given dynamic read amplifiers, the read logic "1" signal can again be completely regenerated and, at the same time, the switching time for the data is reduced.

1 Claim, 5 Drawing Figures

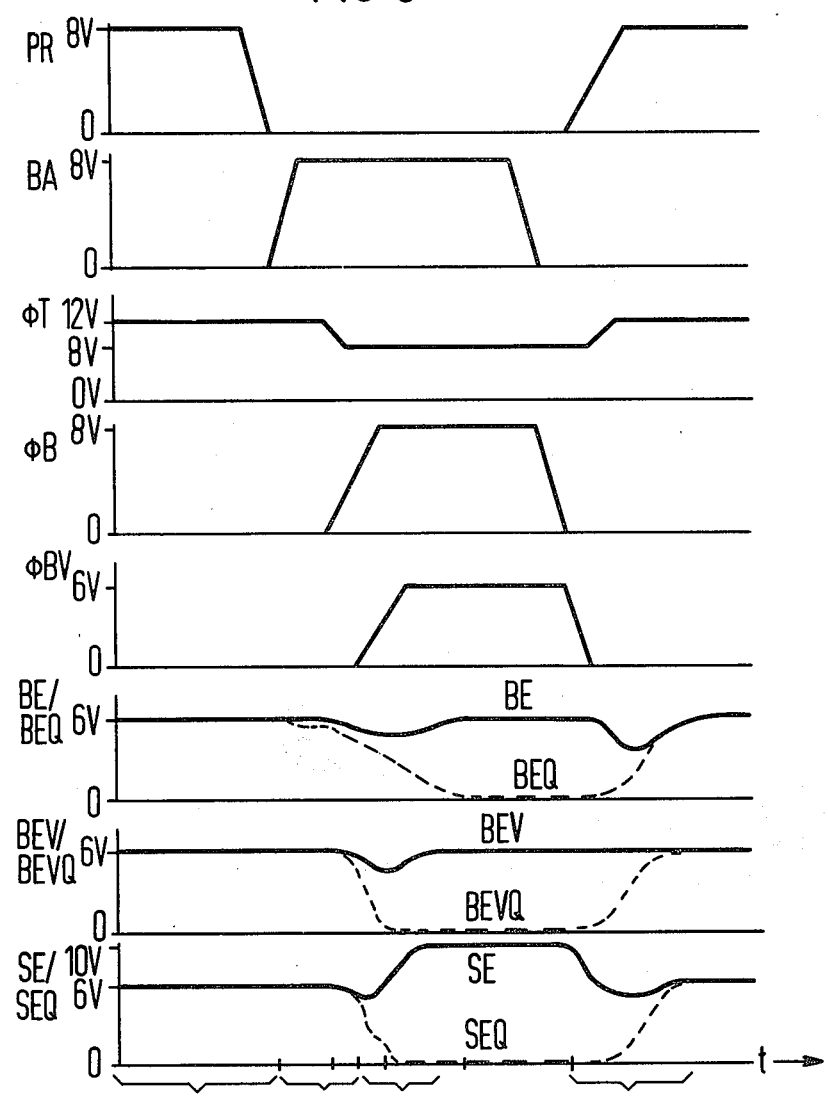

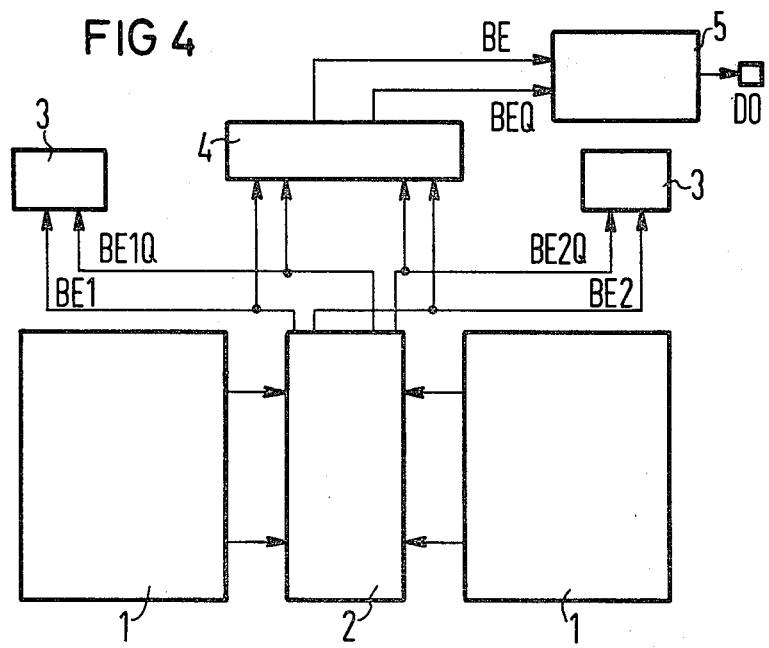
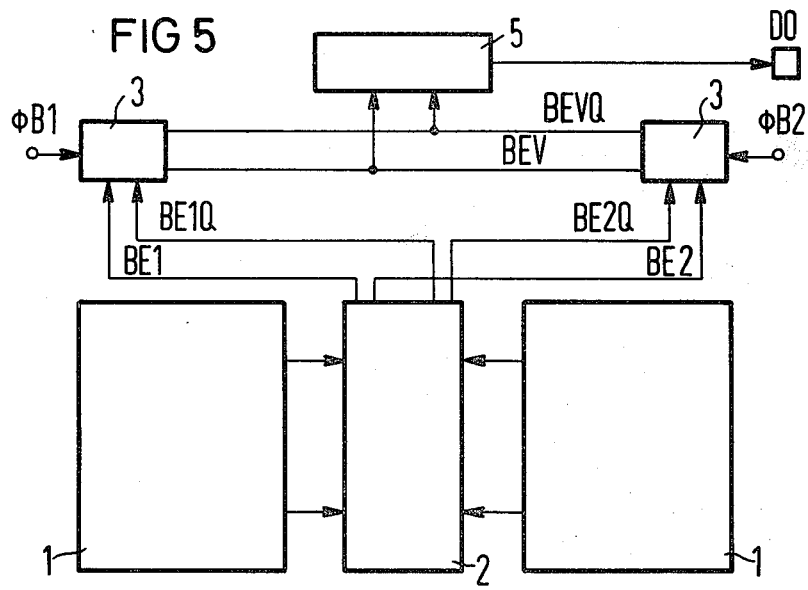

DYNAMIC READ AMPLIFIER FOR METAL-OXIDE-SEMICONDUCTOR MEMORIES

BACKGROUND OF THE INVENTION

1. Field of the Invention

The present invention relates to a dynamic read amplifier for metal-oxide-semiconductor (MOS) memories having a flip-flop comprising two first switching transistors whose low end can be applied to ground via a cut-through transistor by way of a first clock pulse and whose outputs are connected to the information lines via cut-off transistors controlled by a second clock pulse, whereby the information or data lines can be charged to the supply voltage via a pair of charging transistors by way of a third clock voltage.

2. Description of the Prior Art

In MOS memory modules having single-transistor memory cells, small signals must be amplified with a read amplifier. The read amplifiers are constructed as flip-flops and, given dynamic operation, use the data lines as a voltage supply. For this reason, given signal amplification, the signal level for a logical "1" on the data lines is lowered and only a lower potential can be rewritten into the memory cell. In the next read-out cycle, this leads to a diminished read signal.

With static read amplifiers, instead of dynamic read amplifiers, the signal level for a logical "1" is regenerated, but the forward current occurring upon discharge of the signal line for the logical "0" leads to an inadmissibly high leakage power. Heretofore, signal level regeneration was not employed in dynamic read techniques.

SUMMARY OF THE INVENTION

The object of the present invention is to provide a dynamic read amplifier for MOS memories in which the regeneration of a logical "1" level after an evaluation operation is possible without additional leakage power.

In order to achieve the above object, a dynamic read amplifier, constructed in accordance with the present invention, is designed such that two further switching transistors are provided whose gate electrodes and source electrodes respectively are connected to the respective gate and source electrodes of the first switching transistors and whose drain electrodes are respectively connected to the source electrodes of two further charging transistors. The gate electrodes and drain electrodes respectively of the further charging transistors are connected to the appertaining gate and drain electrodes respectively of the first two charging transistors. Two further data lines are connected to the junction points of the further switching transistors to the further charging transistors via two further cut-off transistors controlled by a fourth clock pulse. A fifth clock pulse can be supplied to the junction points via capacitors. Two series connections consisting of two respective transistors lie at both sides of and parallel to the first charging transistors between the supply voltage and the first data lines. The respective gate electrodes are connected to receive the first clock pulses and the gate electrodes of the other two transistors are connected to the junction points of the further switching transistors and the further charging transistors.

Because of this structure, it is achieved that a maximum cell potential is rewritten into the memory cell in the case of a logic "1" level without the leakage power being increased.

Upon employing the structure as an external read amplifier, the complementary signals are available with their final levels on the external data lines (BEV, BEVQ) earlier than on the data lines (BE, BEQ) and can be more quickly forwarded to the data output of the memory module. By so doing, the access time can be shortened.

If the circuit is employed for the evaluation of the read signals of the cell field (internal read amplifier), then the information more quickly available on the data outputs (BEV, BEVQ) can serve for driving an error correction circuit integrated on the memory module.

When the memory cell matrix is subdivided into blocks, a plurality of data lines (BE1/BE1Q, BE2/BE2Q . . . ) had heretofore to be through-connected with a switch to the data output amplifiers. By employing the external read amplifier circuit, the individual read amplifiers can be caused to execute signal amplification with decoded evaluator clocks ($\phi B1$, $\phi B2$, . . . ). The respective information can then be through-connected without a switch to the data output driver via the common data lines (BEV, BEVQ). This organization of the information transmission also effects an abbreviation of the access time.

BRIEF DESCRIPTION OF THE DRAWINGS

Other objects, features and advantages of the invention, its organization, construction and operation will be best understood from the following detailed description, taken in conjunction with the accompanying drawings, on which:

FIG. 3 is a waveform diagram relating to the clocking of the read amplifier of FIG. 2;

FIG. 4 is a schematic illustration of a known organization of a memory module; and FIG. 5 is a schematic illustration of the organization of a memory module employing read amplifiers constructed in accordance with the present invention.

DESCRIPTION OF THE PREFERRED EMBODIMENTS

Figure 1:
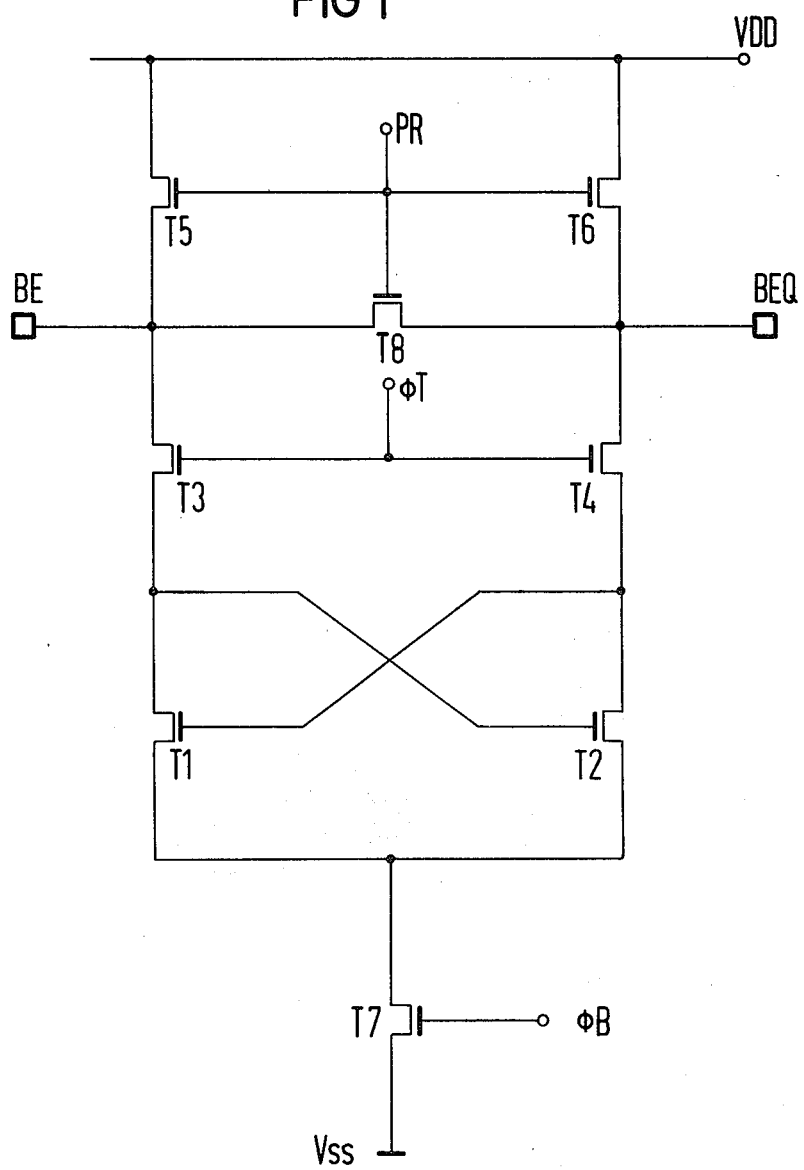
FIG. 1 is a schematic circuit diagram of a known dynamic read amplifier.

In order to evaluate a read signal applied at the data lines BE, BEQ of a known read amplifier according to FIG. 1, a flip-flop arrangement is employed as a differential amplifier. The circuit comprises the flip-flop, formed of two switching transistors T1 and T2, two cut-off transistors T3 and T4 for cutting off the data lines BE and BEQ, and of a switch-through transistor T7 for connecting the low end of the flip-flop to the potential Vss. The data lines are precharged and balanced with a transistor T8 with the assistance of the charging transistors T5 and T6.

Figure 2:
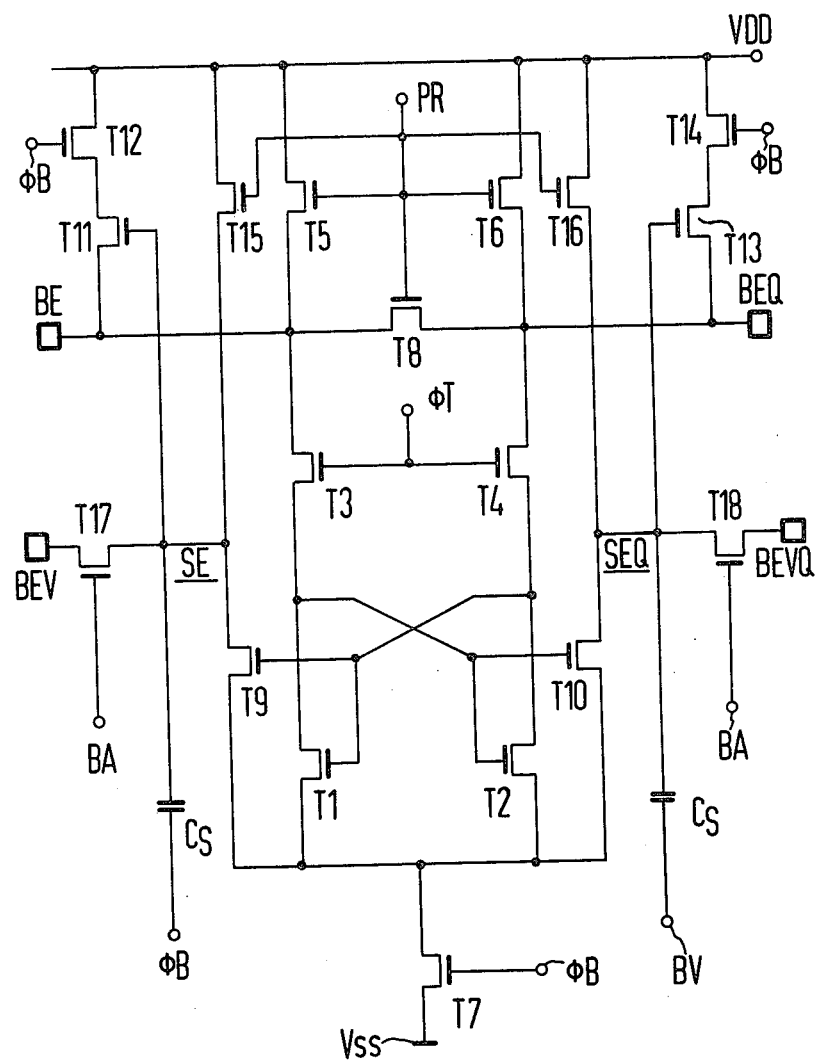
FIG. 2 is a schematic circuit diagram of a read amplifier constructed in accordance with the present invention.

The dynamic read amplifier according to the present invention is illustrated in FIG. 2. The amplifier comprises the elements T1–T8 as described above, as well as additional transistors T9–T18, a pair of additional data lines BEV and BEVQ, and a pair of capacitors $C_S$. With the assistance of this expanded circuit, the data applied at the data lines BE, BEQ can be rapidly through-connected to the outputs BEV, BEVQ and the signal levels on the data lines can be regenerated. The transistors T9, T10 represent two additional switching transistors, whereby the gate electrodes are connected to the gate electrodes of the first switching transistors T1, T2 and their source electrodes are connected to the source electrodes of the first switching transistors T1, T2. The drain electrodes of the two transistors are connected to the source electrodes of two further charging transistors T15, T16, whereby the gate electrodes and the drain electrodes are connected in the same manner as the drain electrodes of the first charging transistors T5, T6. The first data line is charged via two series connections T11, T12 and T13, T14 of two respective transistors which are connected to the supply voltage VDD. The gate electrode of the transistors T11 and T13 are connected to the junction points SE and SEQ.

The manner of operation of the circuit according to FIG. 2 is described in greater detail below on the basis of the pulse diagram of FIG. 3. The pre-charging of the read amplifier occurs in that the third clock pulse PR is turned on. The current supply is therefore applied and the nodes of the two data lines BE, BEQ and SE, SEQ are precharged. At the same time, the first data lines BE and BEQ are balanced to the same potential by way of the balancing transistor T8. Subsequently, the third clock pulse PR is turned off and the differential amplifier is released for dynamic operation.

In order to initiate the read operation, a fourth clock pulse BA is turned on. At the same time, the respective bit line and, thus, a corresponding memory element is selected and the information on the first data lines BE, BEQ is through-connected. The additional cut-off transistors T17, T18 connect the second data lines BEV, BEVQ to the nodes SE, SEQ, respectively. The second clock pulse $\phi$T is then reduced, whereby the capacitances of the first data lines are separated from the differential amplifier in order to enable a rapid switching of the flip-flop and in order to prevent reduction of the signal level for the logic "1", for example on the data BE, too far.

At the same time, the first clock pulse $\phi$B is switched on, whereby the low point of the flip-flop is discharged to zero volts and the flip-flop is set in accordance with the applied data. In the example according to FIG. 3, the one first data line BEQ is discharged, whereas the other first data line BE is slightly lowered, since the data lines operate as a supply voltage for the dynamic read amplifiers and the first cut-off transistors T3, T4 operate as load transistors. By way of the further switching transistors T9, T10 which are switched by the flip-flop nodes, the information is transmitted from the first data lines BE and BEQ, respectively, to the nodes SE, BEV and SEQ, BEVQ. The smaller capacitance of the nodes BEV BEVQ of the second data lines can be more rapidly discharged then the greater capacitance of the first data lines BE, BEQ prescribed by the memory organization.

Upon regeneration, the fifth clock pulse $\phi$BV is first switched on. With the assistance of the capacitances $C_S$, a current is coupled to the nodes SE, SEQ of the second data lines. Depending on the direction in which the flip-flop is flipped, the node (for example the node SE) is boosted to a high potential, whereby the switching transistor T9 is blocked and the switching transistor T10 is conductive to hold the node (for example, SEQ), to zero volts.

The boosted node SE releases the current path across the transistors T11, T12 of the two series connections. The signal level on the node BE of the first data line is regenerated. The node SEQ of the second data line is held to zero volts and blocks the transistor T13 of the other series connection. The node BEQ of the second data line is not connected to the supply voltage VDD, so that no forward current flows.

After transfer of the information from the data lines BEV, BEVQ into the data output driver, the clock lines for the first, fourth and fifth clock voltages $\phi$B, BA, $\phi$BV are switched off at the end of a cycle.

By switching the third clock pulse PR on, the precharging of the data lines and read amplifier nodes begins in the cycle pause and, therefore, a new cycle begins.

The circuit arrangement according to FIG. 2 enables a faster through-connection of the information from the first data lines BE, BEQ via the read amplifier outputs BEV, BEVQ to the data output driver. The remaining qualities of the circuit arrangement, such as the advantages due to a symmetrical design, are not influenced by the additionally-inserted transistors and data outputs.

FIG. 4 illustrates the organization of a memory module of a data switch in the traditional manner. In FIG. 4, the internal read amplifier 2 is respectively driven by left and right cell blocks 1. The outputs BE1, BE2 and BE1Q, BE2Q, respectively, of the external bit lines are conducted in respective pairs to the external read amplifiers 3, where the signal is amplified and respectively supplied to a switch 4 on the same lines, the outputs B, BEQ of the switch 4 being applied to a driver 5 from where the data signal is forwarded to a data line DO. The switch 4 is required in order to respectively privilege the left or right read amplifier 3, given simultaneous occurrence of signals.

FIG. 5 illustrates a memory organization employing read amplifiers according to the present invention. Due to the presence of the additional data lines BEV, BEVQ it is now possible to separately clock the external read amplifiers by way of the gate signals $\phi$B1, $\phi$B2 and, thereby, to avoid an additional switch. The outputs of the two external read amplifiers 3 are directly connected to the driver stage 5. By so doing, the further advantage is achieved that an additional time abbreviation occurs in reading from the memory due to the memory organization itself, so that the time abbreviation is produced both by the format of the read amplifier per se as well as by the organization which thereby becomes possible.

Although I have described my invention by reference to particular illustrative embodiments thereof, many changes and modifications of the invention may become apparent to those skilled in the art without departing from the spirit and scope of the invention. I therefore intend to include within the patent warranted hereon all such changes and modifications as may reasonably and properly be included within the scope of my contribution to the art.

I claim:

1. A dynamic, flip-flop differential read amplifier for metal-oxide-semiconductor memories, and for operation with first through fifth clock pulses, said read amplifier comprising:
    a pair of first data terminals for connection to a pair of first data lines;
    a voltage supply terminal and a ground terminal;
    first, second, third, fourth, fifth, sixth, seventh and eighth field effect transistors each including a source, a drain and a gate;

the drain-source paths of said fifth, third, first and seventh transistors connected in series between said voltage supply terminal and said ground terminal, and the drain-source paths of said sixth, fourth, second and seventh transistors likewise connected in series between said voltage supply terminal and said ground terminal;

said gates of said first and second transistors respectively connected to the drain of the other such transistor to form a flip-flop, with said fifth and sixth transistors operating as load resistors and said third and fourth transistors operating as cut-off transistors;

the drain-source path of said eighth transistor connected between said first data terminals and across the junctions of said fifth and third transistors and said sixth and fourth transistors and operable as a balance transistor;

said gates of said seventh, third and fourth, and fifth and sixth and eighth transistors respectively connected to receive the first, second and third clock pulses;

a pair of second data terminals for connection to a second pair of information lines;

first and second capacitors connected to receive the fifth clock pulses;

ninth, tenth, eleventh, twelfth, thirteenth, fourteenth, fifteenth, sixteenth, seventeenth, and eighteenth field effect transistors each including a source, a drain and a gate;

said ninth and tenth transistors constituting switching transistors having their drain-source paths connected in series with the drain-source paths of said fifteenth and sixteenth transistors, constituting load transistors, respectively, and their gates connected to the gates of said first and second transistors, respectively;

said gates of said fifteenth and sixteenth and transistors connected to said gates of said fifth, sixth and eighth transistors to receive the third clock pulses;

the drain-source paths of said eleventh and twelfth transistors connected in series across said voltage supply terminal and one of said first data terminals, and the drain-source path of said thirteenth and fourteenth transistors connected in series across said voltage supply terminal and the other of said first data terminals;

said gates of said twelfth and fourteenth transistors connected to receive the first clock pulses and said gates of said eleventh and thirteenth transistors connected to receive the fifth clock pulses via said first and second capacitors, respectively;

the drain-source path of said seventeenth transistor connected as a cut-off transistor between one of said second data terminals and said gate of said eleventh transistor, said first capacitor and the junction of said ninth and fifteenth transistors, and said gate of said seventeenth transistor connected to receive the fourth clock pulses; and the drain-source path of said eighteenth transistor connected as a cut-off transistor between the other of said second data terminals and said gate of said thirteenth transistor, said second capacitor and the junction of said tenth and sixteenth transistors, and said gate of said eighteenth transistor connected to receive the fourth clock pulses, whereby the clock pulses are in a sequence such that a third clock pulse operates said fifth, sixth, eighth, fifteenth and sixteenth transistors to connect the supply voltage terminal to said first data terminals and said second data terminals, during such pulse, to prepare said amplifier for dynamic operation, a fourth clock pulse operates said seventeenth and eighteenth transistors to connect the respective second data terminals to the respective junctions of said ninth and fifteenth transistors and tenth and sixteenth transistors, a second clock pulse operates said third and fourth transistors to cut-off from the differential amplifier flip-flop the capacitance of the data lines connected to said first data terminals in order to provide for a fast switching of the flip-flop and to prevent signal level reduction, a first clock pulse, at the same time as a second clock pulse, operates said seventh transistor to connect that end of the flip-flop to ground and permit the flip-flop to be set in accordance with the data applied at the first data terminals causing said third and fourth transistors to operate as loads and causing the data to be applied, via said ninth and tenth transistors and said seventeenth and eighteenth transistors, to said second data terminals, and a fifth clock pulse, at the same time as, and in conjunction with a first clock pulse, causes regeneration by, during the time of such pulses, operating said eleventh, twelfth, thirteenth and fourteenth transistors to connect said supply voltage terminal to said first data terminals and to ground via respective sides of the flip-flop.

* * * * *